United States Patent
Park et al.

(10) Patent No.: US 10,665,811 B2
(45) Date of Patent: May 26, 2020

(54) ELECTROLUMINESCENT DISPLAY DEVICE

(71) Applicant: LG DISPLAY CO., LTD., Seoul (KR)

(72) Inventors: KyoungJin Park, Paju-si (KR); Hanhee Kim, Paju-si (KR); KiSoub Yang, Paju-si (KR); HongMyeong Jeon, Goyang-si (KR); SungGoo Jung, Seoul (KR)

(73) Assignee: LG DISPLAY CO., LTD., Seoul (KR)

( * ) Notice: Subject to any disclaimer, the term of this patent is extended or adjusted under 35 U.S.C. 154(b) by 12 days.

(21) Appl. No.: 15/842,332

(22) Filed: Dec. 14, 2017

(65) Prior Publication Data

US 2018/0184501 A1  Jun. 28, 2018

(30) Foreign Application Priority Data

Dec. 26, 2016 (KR) .................. 10-2016-0179272

(51) Int. Cl.
*H01L 51/52* (2006.01)
*H05B 33/26* (2006.01)
*H05B 33/10* (2006.01)
*H05B 33/20* (2006.01)
*H05B 33/22* (2006.01)
*H05B 33/08* (2020.01)
*H01L 27/32* (2006.01)

(52) U.S. Cl.
CPC ...... *H01L 51/5209* (2013.01); *H01L 27/3246* (2013.01); *H01L 51/5203* (2013.01); *H05B 33/08* (2013.01); *H05B 33/10* (2013.01); *H05B 33/20* (2013.01); *H05B 33/22* (2013.01); *H05B 33/26* (2013.01); *H01L 27/3258* (2013.01)

(58) Field of Classification Search
CPC ............ H01L 27/3246; H01L 27/3283; H01L 27/3295; H01L 27/3727; H01L 27/3258; H01L 27/326; H01L 51/5209; H01L 51/5225
See application file for complete search history.

(56) References Cited

U.S. PATENT DOCUMENTS

| | | | |
|---|---|---|---|
| 7,336,030 B2 | 2/2008 | Funamoto et al. | |
| 9,391,292 B2 * | 7/2016 | Choi | H01L 27/3258 |
| 9,666,829 B2 * | 5/2017 | Ito | H01L 51/5225 |
| 2005/0200273 A1 | 9/2005 | Nozawa | |

(Continued)

FOREIGN PATENT DOCUMENTS

| | | |
|---|---|---|
| CN | 1658726 A | 8/2005 |
| CN | 1665358 B | 9/2010 |
| CN | 103915474 B | 9/2016 |

*Primary Examiner* — Yu Chen
*Assistant Examiner* — Vincent Wall
(74) *Attorney, Agent, or Firm* — Birch, Stewart, Kolasch & Birch, LLP

(57) ABSTRACT

An electroluminescent display device which may improve display quality is discussed. The electroluminescent display device includes a substrate in which a plurality of pixel areas are defined, a first electrode arranged in each pixel area, a light emitting layer on the first electrode within the pixel area, and a second electrode on the light emitting layer. Particularly, a step difference portion is arranged at an edge of the pixel area, and is partially or fully be filled with the light emitting layer. Film uniformity of the light emitting layer within the pixel area may be improved by arrangement of the step difference portion.

15 Claims, 5 Drawing Sheets

(56) References Cited

U.S. PATENT DOCUMENTS

| | | | |
|---|---|---|---|
| 2008/0024402 A1* | 1/2008 | Nishikawa | H01L 51/5209 345/82 |
| 2008/0272992 A1 | 11/2008 | Kwak | |
| 2011/0297943 A1* | 12/2011 | Kim | H01L 27/3258 257/59 |
| 2013/0001603 A1* | 1/2013 | Lim | H01L 51/5209 257/88 |
| 2014/0183470 A1 | 7/2014 | Kim | |
| 2014/0306241 A1* | 10/2014 | Hirakata | H01L 51/5281 257/79 |
| 2014/0312319 A1* | 10/2014 | Kim | H01L 27/3258 257/40 |
| 2017/0092705 A1* | 3/2017 | Lim | H01L 27/322 |
| 2018/0006273 A1* | 1/2018 | Kim | H01L 27/3218 |
| 2018/0159065 A1* | 6/2018 | Kim | H01L 27/3258 |

* cited by examiner

ELECTROLUMINESCENT DISPLAY DEVICE

CROSS REFERENCE TO RELATED APPLICATIONS

This application claims the priority benefit of the Korean Patent Application No. 10-2016-0179272 filed on Dec. 26, 2016 in the Republic of Korea, the disclosure of which is hereby incorporated by reference in its entirety.

BACKGROUND OF THE INVENTION

Field of the Invention

Embodiments of the present invention relate to an electroluminescent display device, and more particularly, to an electroluminescent display device of a large area, which may provide uniform luminance.

Discussion of the Related Art

Recently, flat panel displays having excellent characteristics such as thin profile, light weight, and low power consumption have been widely developed and applied to various fields.

Among the flat panel displays, an electroluminescent display device is a device that emits light by means of radiative recombination of exciton formed by electrons and holes by injecting charges into a light emitting layer formed between a cathode which is an electron injection electrode and an anode which is a hole injection electrode. The electroluminescent display device may be formed on a flexible substrate such as plastic and has a large contrast ratio because of a self-light emitting type. Also, since the electroluminescent display device has a response time of several microseconds (μs), it is easy to realize a moving image, and there is no limitation in a viewing angle.

The electroluminescent display device includes a light emitting material layer arranged between an anode and a cathode. To inject holes from the anode and electrons from the cathode into the light emitting material layer, a hole transporting layer (HTL) and an electron transporting layer (ETL) are respectively arranged between the anode and the light emitting material layer, and between the cathode and the light emitting material layer. At this time, to more efficiently inject the holes and the electrons, the electroluminescent display device further includes a hole injecting layer (HIL) arranged between the anode and the hole transporting layer, and an electron injecting layer (EIL) arranged between the electron transporting layer and the cathode.

The light emitting material layer, the hole injecting layer, the hole transporting layer, the electron transporting layer and the electron injecting layer of the electroluminescent display device are formed by a vacuum thermal evaporation method that selectively evaporates a light emitting material by using a fine metal mask.

However, such a vacuum thermal evaporation method has problems in that the manufacturing cost is increased by the mask and it is difficult to apply the vacuum thermal evaporation process to a display device of a large area and high resolution due to manufacturing deviation of the mask, deflection, shadow effect, etc.

In this respect, a method for forming a light emitting layer by means of a soluble process has been suggested, and an electroluminescent display device based on an ink jet device has received attention. A bank surrounding a pixel area is formed in a soluble process, a solution including a light emitting material is dropped onto the pixel area within the bank using the ink jet device, and then the solution is dried to form a light emitting material layer. Since the electroluminescent display device based on the ink jet device may form a light emitting layer at a needed place relatively exactly, the cost may be saved.

On the other hand, if the light emitting layer is formed using the ink jet device, solvent evaporation within the pixel area is not carried out uniformly during the drying process, whereby a problem occurs in that a thickness of the light emitting material layer does not become uniform.

FIG. 1 is a plane view illustrating a general electroluminescent display device, and FIG. 2 is a cross-sectional view illustrating one pixel area of a general electroluminescent display device.

As shown in FIG. 1, evaporation of a solvent is not carried out uniformly within a pixel area during a drying process of a solution. Particularly, a big difference in a drying speed occurs between a center portion of the light emitting layer and an edge portion of the light emitting layer. Therefore, as shown in FIG. 2, a center portion of the pixel area is formed to be thicker than its edge portion. For this reason, light emission is not uniform, and luminance of the electroluminescent display device is not uniform, whereby image quality is deteriorated.

SUMMARY OF THE INVENTION

Accordingly, embodiments of the present invention are directed to an electroluminescent display device that substantially obviates one or more problems due to limitations and disadvantages of the related art.

An advantage of the embodiments of the present invention is to provide an electroluminescent display device that solves a problem related to increase of a manufacturing cost and a restriction in area and resolution due to an evaporation process.

Another advantage of the embodiments of the present invention is to provide an electroluminescent display device that solves a problem related to deterioration of image quality.

Additional advantages and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these objects and other advantages and in accordance with the purpose of the invention, as embodied and broadly described herein, an electroluminescent display device includes a substrate in which a plurality of pixel areas are defined, a first electrode arranged in each pixel area, a light emitting layer on the first electrode within the pixel area, a second electrode on the light emitting layer, and a step difference portion arranged at an edge of the pixel area.

The step difference portion may partially or fully be filled with the light emitting layer.

Also, the electroluminescent display device may further include a first passivation film between the first electrode and the substrate, wherein the step difference portion may be formed in the first passivation film.

It is to be understood that both the foregoing general description and the following detailed description of the present invention are by example and explanatory and are intended to provide a further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings.

DETAILED DESCRIPTION OF THE EMBODIMENTS

Figure 1:
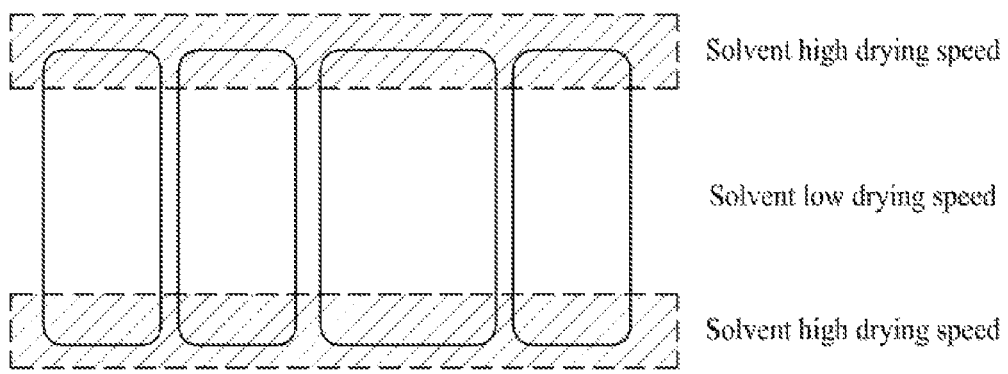
FIG. 1 is a plane view illustrating a related art electroluminescent display device.
Figure 2:
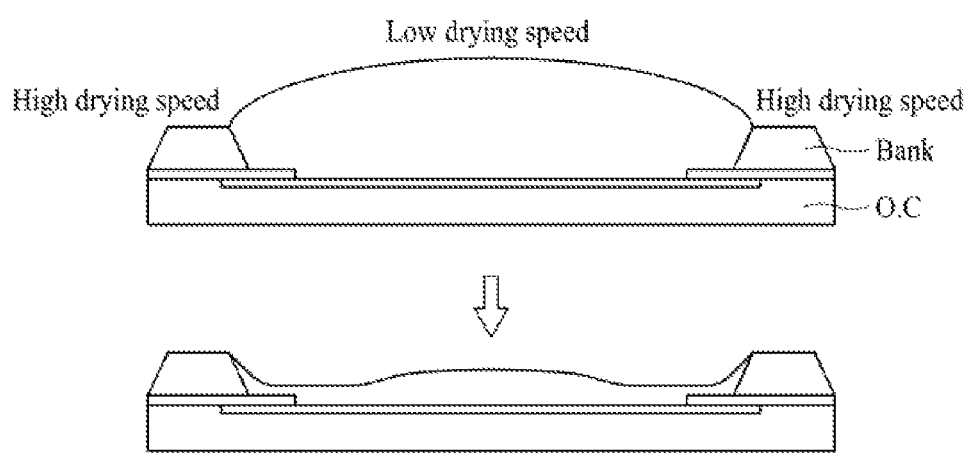
FIG. 2 is a cross-sectional view illustrating one pixel area of a related art electroluminescent display device.

Terms disclosed in this specification should be understood as follows.

The term of a singular expression should be understood to include multiple expressions as well as the singular expression if there is no specific definition in the context. The terms such as "the first" and "the second" are used only to differentiate one element from other elements. Thus, a scope of claims is not limited by these terms. Also, it should be understood that the term such as "include" or "have" does not preclude existence or possibility of one or more features, numbers, steps, operations, elements, parts or their combinations. It should be understood that the term "at least one" includes all combinations related with any one item. For example, "at least one among a first element, a second element and a third element" may include all combinations of two or more elements selected from the first, second and third elements as well as each element of the first, second and third elements. Also, if it is mentioned that a first element is positioned "on or above" a second element, it should be understood that the first and second elements may be brought into contact with each other, or a third element may be interposed between the first and second elements.

An electroluminescent display device according to the present invention comprises a substrate in which a plurality of pixel areas are defined, a first electrode arranged in each pixel area, a light emitting layer on the first electrode within the pixel area, a second electrode on the light emitting layer, and a step difference portion arranged at an edge of the pixel area.

The step difference portion is partially or fully filled with the light emitting layer.

The electroluminescent display device further comprises a first passivation film between the first electrode and the substrate, and the step difference portion is formed on the first passivation film.

For example, the pixel area has a long axis and a short axis, and the step difference portion has a step difference portion arranged along a direction of short axis of the pixel area.

For another example, the pixel area has a long axis and a short axis, and the step difference portion has a first step difference portion arranged along a direction of the short axis of the pixel area and a second step difference portion vertical to the first step difference portion and arranged along a direction of the long axis of the pixel area.

The first step difference portion has a width or depth wider or deeper than that of the second step difference portion.

Also, the electroluminescent display device further comprises a bank arranged between adjacent pixels among the plurality of pixel areas. The bank has an upper bank for partitioning the pixel areas, and a lower bank partially exposed by the upper bank and protruded from a side of the upper bank to the adjacent pixel areas.

The step difference portion is arranged in an area overlapped with the lower bank.

The lower bank and the first passivation film are in contact with each other at the step difference portion.

The electroluminescent display device further comprises a second passivation film arranged between the first passivation film and the substrate, and the lower bank and the second passivation film are in contact with each other at the step difference portion.

In another aspect, in the electroluminescent display device according to the present invention, areas of the lower bank exposed by the upper bank has different shapes within the pixel area.

The lower bank exposed by the upper bank includes a first area having a first width from an inclined surface at one side of the upper bank to an end at one side of the lower bank, and a second area having a second width from the inclined surface at one side of the upper bank to the end at one side of the lower bank, the second with being wider than the first width.

The step difference portion is arranged in the second area.

Also, the step difference portion has a double step difference, such as at least two steps or levels.

The first passivation film corresponding to the edge of the pixel area has a thickness thinner than that of the first passivation film corresponding to a center of the pixel area.

The plurality of pixel areas include red, green and blue pixel areas, and the step difference portion arranged in at least one of the red, green, and blue pixel areas has a width or depth different from that of the step difference portion arranged in the other of the red, green and blue pixel areas.

In other aspect, the electroluminescent display device according to the present invention comprises a substrate in which a plurality of pixel areas are defined, a first electrode arranged in each pixel area, a light emitting layer on the first electrode within the pixel area, a second electrode on the light emitting layer, and a first passivation film arranged below the first electrode, wherein the first passivation film corresponding to an edge of the pixel area has a thickness thinner than that of the first passivation film corresponding to a center of the pixel area.

Hereinafter, the embodiment of the present invention will be described in detail with reference to the accompanying drawings. Wherever possible, the same reference numbers will be used throughout the drawings to refer to the same or like parts. Also, in the following description of the present invention, if a detailed description of elements or functions known in respect of the present invention is determined to make the subject matter of the present invention unnecessarily obscure, the detailed description will be omitted.

Figure 3:
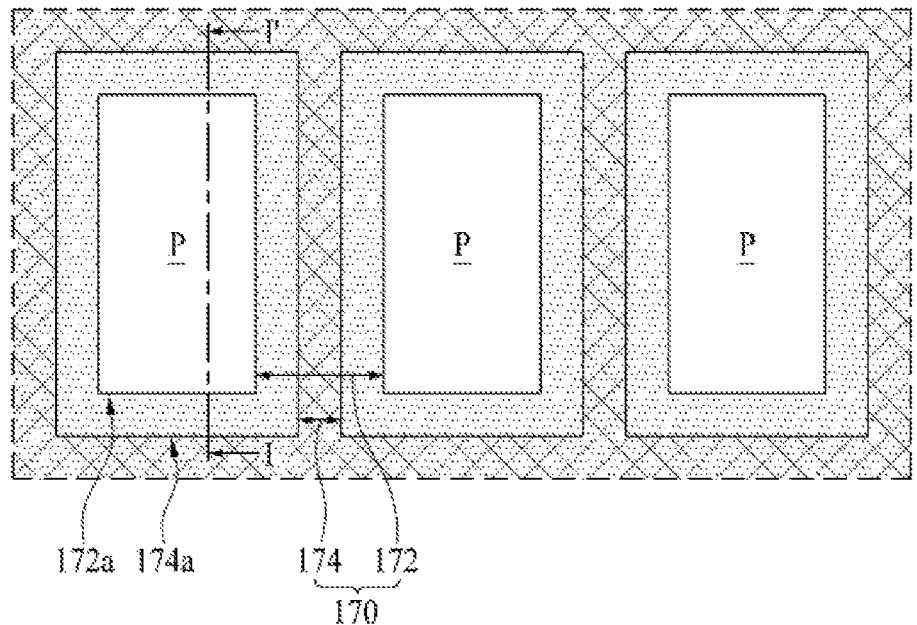
FIG. 3 is a plane view illustrating an electroluminescent display device according to one embodiment of the present invention.
Figure 4:
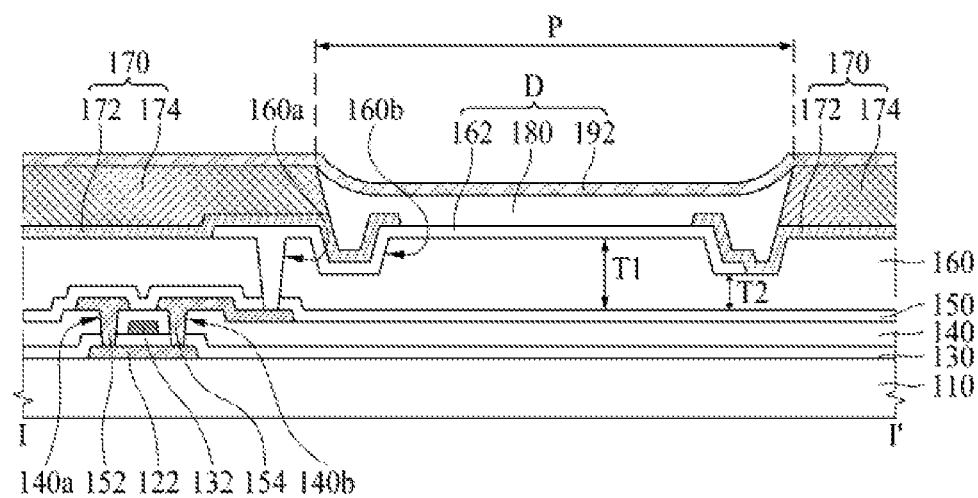
FIG. 4 is a cross-sectional view illustrating one pixel area of an electroluminescent display device according to a first example embodiment of the present invention.

FIG. 3 is a plane view illustrating an electroluminescent display device according to one embodiment of the present invention, and FIG. 4 is a cross-sectional view taken along line I-I' of FIG. 3, illustrating one pixel area of the electroluminescent display device according to a first example embodiment of the present invention. All the components of the electroluminescent display device according to all embodiments of the present invention are operatively coupled and configured.

As shown in FIG. 4, a semiconductor layer 122 which is patterned is formed above a substrate 110. The substrate 110 may be a glass substrate or a flexible substrate made of a polymer material such as polyimide.

The semiconductor layer 122 may be made of an oxide semiconductor material. In this instance, a light-shielding pattern and a buffer layer (not shown) may be formed below the semiconductor layer 122. The light-shielding pattern prevents the semiconductor layer 122 from being degraded by light by shielding light entering the semiconductor layer 122. The buffer layer serves to prevent water or moisture from being permeated into the display device or prevent impurities such as metal ions from being diffused and permeated into the semiconductor layer 122. The buffer layer may be made of an inorganic insulating material, for example, $SiO_2$, SiNx, or a multi-layered film of $SiO_2$ and SiNx. Unlike the buffer layer, the semiconductor layer 122 may be made of polysilicon. In this instance, the buffer layer may be formed between the substrate 110 and the semiconductor layer 122. Also, both edges of the semiconductor layer 122 made of polysilicon may be doped with impurities.

A gate insulating film 130 made of an insulating material is formed on the semiconductor layer 122. The gate insulating film 130 may be made of an inorganic insulating material, for example, $SiO_2$, SiNx, or a multi-layered film of $SiO_2$ and SiNx.

A gate electrode 132 made of a conductive material such as metal is arranged on the gate insulating film 130 to correspond to a center of the semiconductor layer 122.

The gate electrode 132 may be, but not limited to, a single layer or multi-layer comprised of any one of Mo, Al, Cr, Au, Ti, Ni, Nd and Cu or their alloy. Also, a gate line and a first capacitor electrode may be arranged on the gate insulating film 130. The gate line is extended along one direction, and the first capacitor electrode is connected to the gate electrode 132.

Meanwhile, although the gate insulating film 130 is formed on an entire surface of the substrate 110 in one embodiment of the present invention, the gate insulating film 130 may be patterned in the same pattern as that of the gate electrode 132.

An inter-layer dielectric film 140 made of an insulating material is arranged on the gate electrode 132. The inter-layer dielectric film 140 may be made of an inorganic insulating material, for example, $SiO_2$, SiNx, or a multi-layered film of $SiO_2$ and SiNx, or may be made of an organic insulating material such as acrylic resin, epoxy resin, phenolic resin, polyamides resin, polyimides resin, and benzocyclobutene.

The inter-layer dielectric film 140 has first and second contact holes 140a and 140b that expose an upper surface at both sides of the semiconductor layer 122. The first and second contact holes 140a and 140b are spaced apart from the gate electrode 132 at both sides of the gate electrode 132. In this instance, the first and second contact holes 140a and 140b are also formed in the gate insulating film 130. Unlike this instance, if the gate insulating film 130 is patterned in the same pattern as that of the gate electrode 132, the first and second contact holes 140a and 140b are formed only in the inter-layer dielectric film 140.

Source and drain electrodes 152 and 154 are formed of a conductive material such as metal on the inter-layer dielectric film 140. Also, a data line and a power line and a second capacitor electrode may be formed on the inter-layer dielectric film 140.

The source and drain electrodes 152 and 154 are spaced apart from each other based on the gate electrode 132, and are respectively in contact with both sides of the semiconductor layer 122 through the first and second contact holes 140a and 140b. The data line knot shown) is extended along a direction vertical to the gate line not shown), and defined a pixel area P by crossing the gate line, and the power line for supplying a high potential voltage is spaced apart from the data line. The second capacitor electrode (not shown) is connected with the drain electrode 154, and is overlapped with the first capacitor electrode (not shown) to form a storage capacitor using the inter-layer dielectric film 140 between the first capacitor electrode and the second capacitor electrode as a dielectric.

Meanwhile, the semiconductor layer 122, the gate electrode 132 and the source and drain electrodes 152 and 154 constitute a thin film transistor. In this instance, the thin film transistor has a coplanar structure in which the gate electrode 132 and the source and drain electrodes 152 and 154 are arranged at one side of the semiconductor layer 122, that is, above the semiconductor layer 122.

Unlike the coplanar structure, the thin film transistor may have an inverted staggered structure in which the gate electrode is arranged below the semiconductor layer and the source and drain electrode are arranged above the semiconductor layer. In this instance, the semiconductor layer may be made of amorphous silicon.

In this instance, the thin film transistor corresponds to a driving thin film transistor of the electroluminescent display device, and a switching transistor of the same structure as that of the driving thin film transistor is further formed on the substrate 110. The gate electrode 132 of the driving transistor is connected to a drain electrode of the switching thin film transistor, and the source electrode 152 of the driving transistor is connected to a power line. Also, a gate electrode and a source electrode of the switching transistor are respectively connected to the gate line and the data line.

A passivation film 150 of an insulating material is provided on the source and drain electrodes 152 and 154 and serves to protect the thin film transistor. The passivation film 150 may be made of an inorganic insulating material, for example, $SiO_2$, SiNx, or a multi-layered film of $SiO_2$ and SiNx.

A first passivation film 160 is arranged on the passivation film 150. The first passivation film 160 serves to planarize upper portions of the source and drain electrodes 152 and 154. The first passivation film 160 may be made of an organic insulating material such as benzocyclobutene, acrylic resin, epoxy resin, phenolic resin, polyamides resin, and polyimides resin.

The first passivation film 160 has a drain contact hole 160a that exposes the drain electrode 154. The drain electrode 154 is electrically connected with a first electrode 162, which will be described later, through the drain contact hole 160a.

The first passivation film 160 according to the first example embodiment of the present invention includes a step difference portion 160b. The step difference portion 160b is arranged to correspond to an edge of each pixel area P partitioned by a bank 170, which will be described later, and may be formed by partially removing the first passivation film 160. The step difference portion 160b may have a depth smaller than the thickness of the first passivation film 160. Therefore, a thickness T2 of the first passivation film 160, which corresponds to the edge of the pixel area P, is thinner than a thickness T1 of the first passivation film 160, which corresponds to the center of the pixel area P.

On the other hand, a depth of the step difference portion 160b formed in the first passivation film 160 may be the same as that of the first passivation film 160. That is, the first passivation film 160 within the step difference portion 160b may fully be removed to expose the passivation film 150 below the first passivation film 160.

A drying speed at the edge of the pixel area P and a drying speed at the center of the pixel area P may be controlled to be the same as each other through the step difference portion 160b, whereby uniformity of a film which is formed may be improved. This will be described later in detail.

The first electrode 162 is formed on the first passivation film 160 to correspond to the pixel area P. The first electrode 162 is electrically connected with the drain electrode 154 through the drain contact hole 160a. The first electrode 162 according to one example may be made of a transparent conductive material, which has a relatively large work function value, such as indium tin oxide (ITO), indium zinc oxide (IZO), zinc oxide or $In_2O_3$, whereby the first electrode 162 may serve as an anode. The first electrode 162 includes a gutter where the first passivation film 160 has the step difference portion 160b. The gutter may be a trench that extends along a periphery of the first electrode 162, and may have inclined sides and a bottom that is flat. The bottom may be parallel to an upper surface of the first electrode 162 or the first passivation film 160.

The bank 170 is arranged on the first electrode 162 as an insulating material. The bank 170 is provided between adjacent pixel areas P to partition the pixel areas P, and covers the edge of the first electrode 162.

In more detail, the bank 170 includes an upper bank 174 for partitioning the pixel areas P, and a lower bank 172 having a width wider than that of the upper bank 174, partially exposed by the upper bank 174. The lower bank 172 exposed by the upper bank 174 is protruded from a side of the upper bank 174 to the pixel area P. The protruded lower bank 172 covers the edge of the first electrode 162.

The lower bank 172 is made of a material having a surface energy relatively higher than that of the upper bank 174 to lower a contact angle with a material of the light emitting layer, which is formed later, and the upper bank 174 is made of a material having a relatively low surface energy to increase the contact angle with the material of the light emitting layer, which is formed later, whereby the material of the light emitting layer is prevented from being overflown to the pixel area P adjacent thereto. Therefore, the surface energy of the lower bank 172 is higher than that of the upper bank 174. For example, the lower bank 172 may be made of an inorganic insulating material or an organic insulating material, which has hydrophilic property, and the upper bank 174 may be made of an organic insulating material having hydrophobic property.

The upper bank 172 is extended to the step difference portion 160b formed in the first passivation film 160, and is formed along the pattern of the step difference portion 160b. The lower bank 172 may partially or fully cover the step difference portion 160b. That is, the step difference portion 160b may be arranged in an area overlapped with the lower bank 172.

If the step difference portion 160b is formed by partially removing the first passivation film 160, the first passivation film 160 and the lower bank 172 are in contact with each other at the step difference portion 160b. On the other hand, if the step difference portion 160b is formed by fully removing the first passivation film 160, the passivation film 150 arranged below the first passivation film 160 is exposed to be partially in contact with the lower bank 172.

The light emitting layer 180 is arranged on the first electrode 162 and the lower bank 172 exposed by the upper bank 174. The light emitting layer 180 may be formed by a soluble process. A printing method or coating method, which uses a jet device that includes a plurality of nozzles, may be used as the soluble process. The soluble process is not limited to the printing method or coating method. For example, an inkjet printing method may be used as the soluble process.

The light emitting layer 180 may include a hole auxiliary layer, an emitting material layer (EML) and an electron auxiliary layer, which are sequentially deposited from the upper portion of the first electrode 162. The hole auxiliary layer may include at least one of a hole injecting layer (HIL) and a hole transporting layer (HTL). The electron auxiliary layer may include at least one of an electron transporting layer (ETL) and an electron injecting layer (EIL). The emitting material layer (EML) may be made of an organic emitting material for emitting phosphor or fluorescence, an organic and inorganic hybrid emitting material, or an inorganic emitting material such as quantum dot (QD).

In this instance, the hole auxiliary layer and the emitting material layer may be formed only within the pixel area P, and the electron auxiliary layer may substantially be formed on the entire surface of the substrate 110. In this instance, the hole auxiliary layer and the emitting material layer may be formed through the soluble process, and the electron auxiliary layer may be formed through a vacuum evaporation process.

The step difference portion may partially or fully be filled with the light emitting layer 180. Therefore, more ink may be filled in the step difference portion 160b than the center of the pixel area P, whereby a drying speed of the step difference portion 160b may be lowered. That is, the drying speed at the edge of the pixel area P may be lowered to allow the edge of the pixel area to be dried at the same drying speed as that of the center of the pixel area, whereby planarization of the film is improved.

A second electrode 192 is substantially formed of a conductive material, which has a relatively low work function, on the light emitting layer 180 over the entire surface of the substrate 110. In this instance, the second electrode 192 may be formed of Al, Mg, Ag, Li, Ca, or their alloy.

The first electrode 162, the light emitting layer 180 and the second electrode 192 constitute an electroluminescent diode D, wherein the first electrode 162 serves as an anode, and the second electrode 192 serves as a cathode.

An encapsulation film may be arranged on the second electrode 192 to prevent external water from being permeated into the electroluminescent diode D. For example, the encapsulation film may have, but not limited to, a deposition structure of a first inorganic insulating layer, an organic insulating layer and a second inorganic insulating layer.

In this instance, the electroluminescent display device according to one embodiment of the present invention may be a bottom emission type in which light emitted from the light emitting layer 180 is output to the outside through the first electrode 162.

Figure 5:
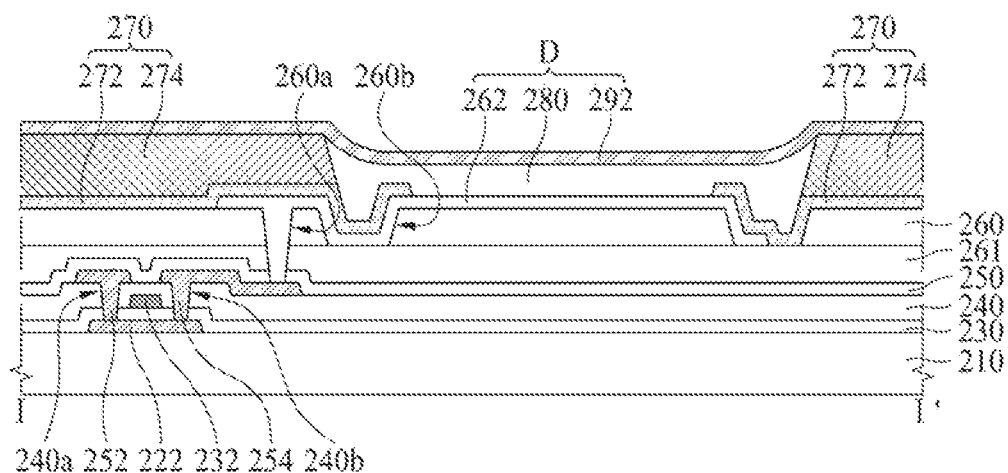
FIG. 5 is a cross-sectional view illustrating one pixel area of an electroluminescent display device according to a second example embodiment of the present invention.

FIG. 5 is a cross-sectional view taken along line I-I' of FIG. 3, illustrating one pixel area according to a second example embodiment of the present invention. In this instance, a second passivation film 261 is added to the pixel area according to the first example shown in FIG. 4. Therefore, in the following description, a first passivation film 260, the second passivation film 261, a bank 270 and an electroluminescent diode layer D will only be described, and repeated description of the same elements will be omitted or may be brief.

Referring to FIG. 5, the additional second passivation film 261 is arranged below the first passivation film 260 of the electroluminescent display device according to the second example embodiment of the present invention. That is, the second passivation film 261 is arranged between the first passivation film 260 and the passivation film 250 that protects the thin film transistor. The second passivation film 261 serves to planarize the upper portions of the source and drain electrodes 252 and 254 in the same manner as the first passivation film 260. The second passivation film 261 may be made of an organic insulating material such as benzocyclobutene, acrylic resin, epoxy resin, phenolic resin, polyamides resin, and polyimides resin.

The first passivation film 260 and the second passivation film 261 have a drain contact hole 260a that exposes the drain electrode 254. The drain electrode 254 is electrically connected with a first electrode 262, which will be described later, through the drain contact hole 260a.

The first passivation film 260 according to the second example embodiment of the present invention includes a step difference portion 260b. The step difference portion 260b is arranged to correspond to an edge of each pixel area P partitioned by a bank 270, which will be described later, and may be formed by partially removing the first passivation film 260. The step difference portion 260b may have a depth smaller than the thickness of the first passivation film 260. Therefore, a thickness of the first passivation film 260, which corresponds to the edge of the pixel area P, is thinner than that of the first passivation film 260, which corresponds to the center of the pixel P.

On the other hand, a depth of the step difference portion 260b formed in the first passivation film 260 may be the same as that of the first passivation film 260. That is, the first passivation film 260 within the step difference portion 260b may fully be removed to expose the second passivation film 261 below the first passivation film 260.

A drying speed at the edge of the pixel area P and a drying speed at the center of the pixel area P may be controlled to be the same as each other through the step difference portion 260b, whereby uniformity of a film which is formed may be improved. This will be described later in detail.

The first electrode 262 is formed on the first passivation film 260 to correspond to the pixel area P. The first electrode 262 is electrically connected with the drain electrode 254 through the drain contact hole 260a. The first electrode 262 according to one example may be made of a transparent conductive material, which has a relatively large work function value, such as indium tin oxide (ITO), indium zinc oxide (IZO), zinc oxide or $In_2O_3$, whereby the first electrode 262 may serve as an anode.

The bank 270 is arranged on the first electrode 262 as an insulating material. The bank 270 is provided between adjacent pixel areas P to partition the pixel areas P, and covers the edge of the first electrode 262.

In more detail, the bank 270 includes an upper bank 274 for partitioning the pixel areas P, and a lower bank 272 having a width wider than that of the upper bank 274, partially exposed by the upper bank 274. The lower bank 272 exposed by the upper bank 274 is protruded from a side of the upper bank 274 to the pixel area P. The protruded lower bank 272 covers the edge of the first electrode 262.

The lower bank 272 is made of a material having a surface energy relatively higher than that of the upper bank 274 to lower a contact angle with a material of a light emitting layer, which is formed later, and the upper bank 274 is made of a material having a relatively low surface energy to increase the contact angle with the material of the light emitting layer, which is formed later, whereby the material of the light emitting layer is prevented from being overflown to the pixel area P adjacent thereto. Therefore, the surface energy of the lower bank 272 is higher than that of the upper bank 274. For example, the lower bank 272 may be made of an inorganic insulating material or an organic insulating material, which has hydrophilic property, and the upper bank 274 may be made of an organic insulating material having hydrophobic property.

The upper bank 272 is extended to the step difference portion 260b formed in the first passivation film 260, and is formed along the pattern of the step difference portion 260b. The lower bank 272 may partially or fully cover the step difference portion 260b. That is, the step difference portion 260b may be arranged in an area overlapped with the lower bank 272.

If the step difference portion 260b is formed by partially removing the first passivation film 260, the first passivation film 260 and the lower bank 272 are in contact with each other at the step difference portion 260b. On the other hand, if the step difference portion 260b is formed by fully removing the first passivation film 260, the second passivation film 261 arranged below the first passivation film 260 is exposed to be partially in contact with the lower bank 272.

The light emitting layer 280 is arranged on the first electrode 262 and the lower bank 272 exposed by the upper bank 274. The light emitting layer 280 may be formed by a soluble process. A printing method or coating method, which uses a jet device that includes a plurality of nozzles, may be used as the soluble process. The soluble process is not limited to the printing method or coating method. For example, an inkjet printing method may be used as the soluble process.

The light emitting layer 280 may include a hole auxiliary layer, an emitting material layer (EML) and an electron auxiliary layer, which are sequentially deposited from the upper portion of the first electrode 262. The hole auxiliary layer may include at least one of a hole injecting layer (HIL) and a hole transporting layer (HTL), and the electron auxiliary layer may include at least one of an electron transporting layer (ETL) and an electron injecting layer (EIL). The emitting material layer (EML) may be made of an organic emitting material for emitting phosphor or fluorescence, an organic and inorganic hybrid emitting material, or an inorganic emitting material such as quantum dot (QD).

In this instance, the hole auxiliary layer and the emitting material layer may be formed only within the pixel area P, and the electron auxiliary layer may substantially be formed on the entire surface of the substrate 210. In this instance, the hole auxiliary layer and the emitting material layer may be formed through the soluble process, and the electron auxiliary layer may be formed through a vacuum evaporation process.

The step difference portion may partially or fully be filled with the light emitting layer 280. Therefore, more ink may be filled in the step difference portion 260b than the center of the pixel area P, whereby a drying speed of the step difference portion 260b may be lowered. That is, the drying speed at the edge of the pixel area P may be lowered to allow the edge of the pixel area P to be dried at the same drying speed as that of the center of the pixel area, whereby planarization of the film is improved.

A second electrode 292 is substantially formed of a conductive material, which has a relatively low work function, on the light emitting layer 280 over the entire surface of the substrate 210. In this instance, the second electrode 292 may be formed of Al, Mg, Ag, Li, Ca, or their alloy.

The first electrode 262, the light emitting layer 280 and the second electrode 292 constitute an electroluminescent diode D, wherein the first electrode 262 serves as an anode, and the second electrode 292 serves as a cathode.

An encapsulation film may be arranged on the second electrode 292 to prevent external water from being permeated into the electroluminescent diode D. For example, the encapsulation film may have, but not limited to, a deposition structure of a first inorganic insulating layer, an organic insulating layer and a second inorganic insulating layer.

In this instance, the electroluminescent display device according to one embodiment of the present invention may be a bottom emission type in which light emitted from the light emitting layer 280 is output to the outside through the first electrode 262.

Figure 6:
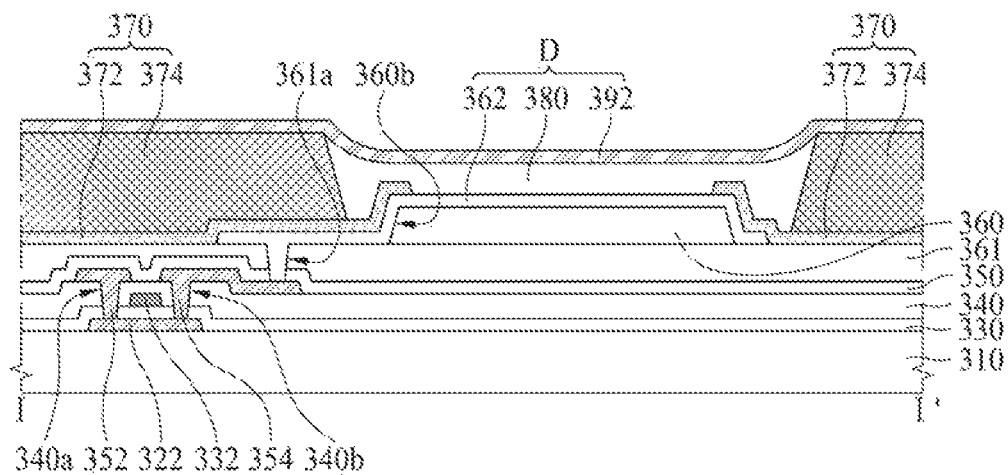
FIG. 6 is a cross-sectional view illustrating one pixel area of an electroluminescent display device according to a third example embodiment of the present invention.

FIG. 6 is a cross-sectional view taken along line I-I' of FIG. 3, illustrating one pixel area according to a third example embodiment of the present invention. In this instance, a second passivation film 361 is added to the pixel area according to the first example shown in FIG. 4 and has a structure different from that of the second example shown in FIG. 5. Therefore, in the following description, a first passivation film 360, the second passivation film 361, a bank 370 and an electroluminescent diode layer D will only be described, and repeated description of the same elements will be omitted or may be brief.

Referring to FIG. 6, the additional second passivation film 361 is arranged below the first passivation film 360 of the electroluminescent display device according to the third example embodiment of the present invention. That is, the second passivation film 361 is arranged between the first passivation film 360 and the passivation film 350 that protects the thin film transistor. The second passivation film 361 serves to planarize the upper portions of the source and drain electrodes 352 and 354 in the same manner as the first passivation film 360. The second passivation film 361 may be made of an organic insulating material such as benzocyclobutene, acrylic resin, epoxy resin, phenolic resin, polyamides resin, and polyimides resin.

The second passivation film 361 has a drain contact hole 361a that exposes the drain electrode 354. The drain electrode 354 is electrically connected with a first electrode 362, which will be described later, through the drain contact hole 361a.

The first passivation film 360 according to the third example embodiment of the present invention includes a step difference portion 360b. The first passivation film 360 is arranged only within the pixel area P, and is not arranged in areas other than the pixel area P. In more detail, a width W1 of the first passivation film 360 is narrower than a width W2 of the pixel area P partitioned through the upper bank 374 of the bank 370, which will be described later. That is, the first passivation film 360 is arranged to be spaced apart from the upper bank 374 so as not to be in contact with the upper bank 374, whereby the step difference portion 360b is provided at the edge of the pixel area P.

Therefore, the second passivation film 361 below the first passivation film 360 is exposed to a partial area of the step difference portion 360b.

A drying speed at the edge of the pixel area P and a drying speed at the center of the pixel area P may be controlled to be the same as each other through the step difference portion 360b, whereby uniformity of a film which is formed may be improved. This will be described later in detail.

The first electrode 362 is formed on the first passivation film 360 and the second passivation film 361 to correspond to the pixel area P. The first electrode 362 is electrically connected with the drain electrode 354 through the drain contact hole 361a. The first electrode 362 according to one example may be made of a transparent conductive material, which has a relatively large work function value, such as indium tin oxide (ITO), indium zinc oxide (IZO), zinc oxide or $In_2O_3$, whereby the first electrode 362 may serve as an anode.

The bank 370 is arranged on the first electrode 362 as an insulating material. The bank 370 is provided between adjacent pixel areas P to partition the pixel areas P, and covers the edge of the first electrode 362.

In more detail, the bank 370 includes an upper bank 374 for partitioning the pixel areas P, and a lower bank 372 having a width wider than that of the upper bank 374, partially exposed by the upper bank 374. The lower bank 372 exposed by the upper bank 374 is protruded from a side of the upper bank 374 to the pixel area P. The protruded lower bank 372 covers the edge of the first electrode 362.

The lower bank 372 is made of a material having a surface energy relatively higher than that of the upper bank 374 to lower a contact angle with a material of a light emitting layer, which is formed later, and the upper bank 374 is made of a material having a relatively low surface energy to increase the contact angle with the material of the light emitting layer, which is formed later, whereby the material of the light emitting layer is prevented from being overflown to the pixel area P adjacent thereto. Therefore, the surface energy of the lower bank 372 is higher than that of the upper bank 374. For example, the lower bank 372 may be made of an inorganic insulating material or an organic insulating material, which has hydrophilic property, and the upper bank 374 may be made of an organic insulating material having hydrophobic property.

The upper bank 372 is extended to one side or upper surface of the first passivation film 360 arranged in the pixel area P, and is formed along the pattern of the step difference portion 360b. That is, the step difference portion 360b may be arranged in an area overlapped with the lower bank 372. Also, the second passivation film and the lower 372 are in contact with each other at some area of the step difference portion 360b to which the second passivation film 361 is partially exposed.

In this way, if the first passivation film 360 is formed only at some area within the pixel area P to form the step difference portion 360b, the organic insulating film may be formed only if necessary, whereby the process may be performed more simply.

The light emitting layer 380 is arranged on the first electrode 362 and the lower bank 372 exposed by the upper bank 374. The light emitting layer 380 may be formed by a soluble process. A printing method or coating method, which uses a jet device that includes a plurality of nozzles, may be used as the soluble process. The soluble process is not limited to the printing method or coating method. For example, an inkjet printing method may be used as the soluble process.

The light emitting layer 380 may include a hole auxiliary layer, an emitting material layer (EML) and an electron auxiliary layer, which are sequentially deposited from the upper portion of the first electrode 362. The hole auxiliary layer may include at least one of a hole injecting layer (HIL) and a hole transporting layer (HTL), and the electron auxiliary layer may include at least one of an electron transporting layer (ETL) and an electron injecting layer (EIL). The emitting material layer (EML) may be made of an organic emitting material for emitting phosphor or fluorescence, an organic and inorganic hybrid emitting material, or an inorganic emitting material such as quantum dot (QD).

In this instance, the hole auxiliary layer and the emitting material layer may be formed only within the pixel area P, and the electron auxiliary layer may substantially be formed on the entire surface of the substrate 310. In this instance, the hole auxiliary layer and the emitting material layer may be formed through the soluble process, and the electron auxiliary layer may be formed through a vacuum evaporation process.

The step difference portion may partially or fully be filled with the light emitting layer 380. Therefore, more ink may be filled in the step difference portion 360b than the center of the pixel area P, whereby a drying speed of the step difference portion 360b may be lowered. That is, the drying speed at the edge of the pixel area P may be lowered to allow the edge of the pixel area P to be dried at the same drying speed as that of the center of the pixel area, whereby planarization of the film is improved.

A second electrode 392 is substantially formed of a conductive material, which has a relatively low work function, on the light emitting layer 380 over the entire surface of the substrate 210. In this instance, the second electrode 392 may be formed of Al, Mg, Ag, Li, Ca, or their alloy.

The first electrode 362, the light emitting layer 380 and the second electrode 392 constitute an electroluminescent diode D, wherein the first electrode 362 serves as an anode, and the second electrode 392 serves as a cathode.

An encapsulation film may be arranged on the second electrode 392 to prevent external water from being permeated into the electroluminescent diode D. For example, the encapsulation film may have, but not limited to, a deposition structure of a first inorganic insulating layer, an organic insulating layer and a second inorganic insulating layer.

In this instance, the electroluminescent display device according to one embodiment of the present invention may be a bottom emission type in which light emitted from the light emitting layer 380 is output to the outside through the first electrode 362.

Figure 7:
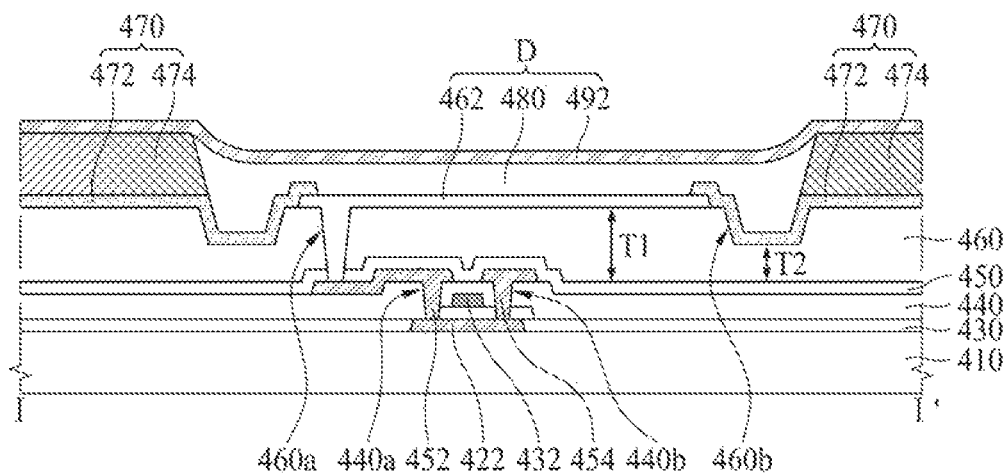
FIG. 7 is a cross-sectional view illustrating one pixel area of an electroluminescent display device according to a fourth example embodiment of the present invention.

FIG. 7 is a cross-sectional view taken along line I-I' of FIG. 3, illustrating one pixel area according to a fourth example embodiment of the present invention. In this instance, a light emission type is different from that of the electroluminescent display device shown in FIGS. 4 to 6. For example, since the electroluminescent display device according to this example is a top emission type in which emitted light is output to the outside through a second electrode 462, which will be described later, the thin film transistor may be arranged in the pixel area P. Therefore, in the following description, a first passivation film 460, a second passivation film 461, a bank 470 and an electroluminescent diode layer D will only be described, and repeated description of the same elements will be omitted or may be brief.

Referring to FIG. 7, the first passivation film 460 of the electroluminescent display device according to the fourth example embodiment of the present invention serves to planarize upper portions of source and drain electrodes 452 and 454. The first passivation film 460 may be made of an organic insulating material such as benzocyclobutene, acrylic resin, epoxy resin, phenolic resin, polyamides resin, and polyimides resin.

A second passivation film may additionally be arranged below the first passivation film 460. That is, the second passivation film may be arranged between the first passivation film 460 and a passivation film 450 that protects the thin film transistor. The second passivation film serves to planarize the upper portions of the source and drain electrodes 452 and 454 in the same manner as the first passivation film 460. The second passivation film may be made of an organic insulating material such as benzocyclobutene, acrylic resin, epoxy resin, phenolic resin, polyamides resin, and polyimides resin.

The first passivation film 460 has a drain contact hole 460a that exposes the drain electrode 454. The drain electrode 454 is electrically connected with a first drain electrode 462, which will be described later, through the drain contact hole 460a. If the second passivation film is arranged below the first passivation film 460, the second passivation film is provided with a drain contact hole 460a formed at a position corresponding to the first passivation film 460.

The first passivation film 460 according to the fourth example embodiment of the present invention includes a step difference portion 460b. The step difference portion 460b is arranged to correspond to the edge of the pixel area P partitioned by the bank 470, which will be described later, and may be formed by partially removing the first passivation film 460. The step difference portion 460b may have a depth smaller than the thickness of the first passivation film 460. Therefore, a thickness T2 of the first passivation film 460, which corresponds to the edge of the pixel area P, is thinner than a thickness T1 of the first passivation film 460, which corresponds to the center of the pixel P.

On the other hand, a depth of the step difference portion 460b formed in the first passivation film 460 may be the same as that of the first passivation film 460. That is, the first passivation film 460 within the step difference portion 460b may fully be removed to expose the second passivation film below the first passivation film 460.

A drying speed at the edge of the pixel area P and a drying speed at the center of the pixel area P may be controlled to be the same as each other through the step difference portion 460b, whereby uniformity of a film which is formed may be improved.

The first electrode 462 is formed on the first passivation film 460 to correspond to the pixel area P. The first electrode 462 is electrically connected with the drain electrode 454 through the drain contact hole 460a. The first electrode 462 according to the fourth example embodiment of the present invention may include a transparent conductive material, which has a relatively large work function value, such as indium tin oxide (ITO), indium zinc oxide (IZO), zinc oxide or $In_2O_3$, and may further include a reflective layer that may upwardly reflect light. For example, the reflective layer may be made of an alloy of aluminum-paladium-copper (APC), or the first electrode 462 may have a triple structure of ITO/APC/ITO including the reflective layer.

The bank 470 is arranged on the first electrode 462 as an insulating material. The bank 470 is provided between adjacent pixel areas P to partition the pixel areas P, and covers the edge of the first electrode 462. In an instance of the top emission type, since the thin film transistor is arranged at the position corresponding to the pixel area P, an area where the bank 479 is formed may be narrower than that of the bottom emission type.

In more detail, the bank 470 includes an upper bank 474 for partitioning the pixel areas P, and a lower bank 472 having a width wider than that of the upper bank 474, partially exposed by the upper bank 474. The lower bank 472 exposed by the upper bank 474 is protruded from a side of the upper bank 474 to the pixel area P. The protruded lower bank 472 covers the edge of the first electrode 462.

The lower bank 472 is made of a material having a surface energy relatively higher than that of the upper bank 474 to lower a contact angle with a material of a light emitting layer, which is formed later, and the upper bank 474 is made of a material having a relatively low surface energy to increase the contact angle with the material of the light emitting layer, which is formed later, whereby the material of the light emitting layer is prevented from being overflown to the pixel area P adjacent thereto. Therefore, the surface energy of the lower bank 472 is higher than that of the upper bank 474. For example, the lower bank 472 may be made of an inorganic insulating material or an organic insulating material, which has hydrophilic property, and the upper bank 474 may be made of an organic insulating material having hydrophobic property.

The upper bank 472 is extended to the step difference portion 460b formed in the first passivation film 460, and is formed along the pattern of the step difference portion 460b. The lower bank 472 may partially or fully cover the step difference portion 460b. That is, the step difference portion 460b may be arranged in an area overlapped with the lower bank 472.

If the step difference portion 460b is formed by partially removing the first passivation film 460, the first passivation film 460 and the lower bank 472 are in contact with each other at the step difference portion 460b. On the other hand, if the step difference portion 460b is formed by fully removing the first passivation film 460, the passivation film 450 or the second passivation film 461 arranged below the first passivation film 460 is partially exposed to be in contact with the lower bank 472.

The light emitting layer 480 is arranged on the first electrode 462 and the lower bank 472 exposed by the upper bank 474. The light emitting layer 480 may be formed by a soluble process. A printing method or coating method, which uses a jet device that includes a plurality of nozzles, may be used as the soluble process. The soluble process is not limited to the printing method or coating method. For example, an inkjet printing method may be used as the soluble process.

The light emitting layer 480 may include a hole auxiliary layer, an emitting material layer (EML) and an electron auxiliary layer, which are sequentially deposited from the upper portion of the first electrode 462. The hole auxiliary layer may include at least one of a hole injecting layer (HIL) and a hole transporting layer (HTL), and the electron auxiliary layer may include at least one of an electron transporting layer (ETL) and an electron injecting layer (EIL). The emitting material layer (EML) may be made of an organic emitting material for emitting phosphor or fluorescence, an organic and inorganic hybrid emitting material, or an inorganic emitting material such as quantum dot (QD).

In this instance, the hole auxiliary layer and the emitting material layer may be formed only within the pixel area P, and the electron auxiliary layer may substantially be formed on the entire surface of the substrate 410. In this instance, the hole auxiliary layer and the emitting material layer may be formed through the soluble process, and the electron auxiliary layer may be formed through a vacuum evaporation process.

The step difference portion 460b may partially or fully be filled with the light emitting layer 480. Therefore, more ink may be filled in the step difference portion 460b than the center of the pixel area P, whereby a drying speed of the step difference portion 460b may be lowered. That is, the drying speed at the edge of the pixel area P may be lowered to allow the edge of the pixel area P to be dried at the same drying speed as that of the center of the pixel area, whereby planarization of the film is improved.

A second electrode 492 is formed of a conductive material, which has a relatively low work function, on the light emitting layer 480. In this instance, the second electrode 492 may include Al, Mg, Ag, Li, Ca, or their alloy, has a relatively low thickness to transmit light. Light transmittance of the second electrode 492 may be 45% to 50%, approximately.

The first electrode 462, the light emitting layer 480 and the second electrode 492 constitute an electroluminescent diode D, wherein the first electrode 462 serves as an anode, and the second electrode 492 serves as a cathode.

Figure 8:
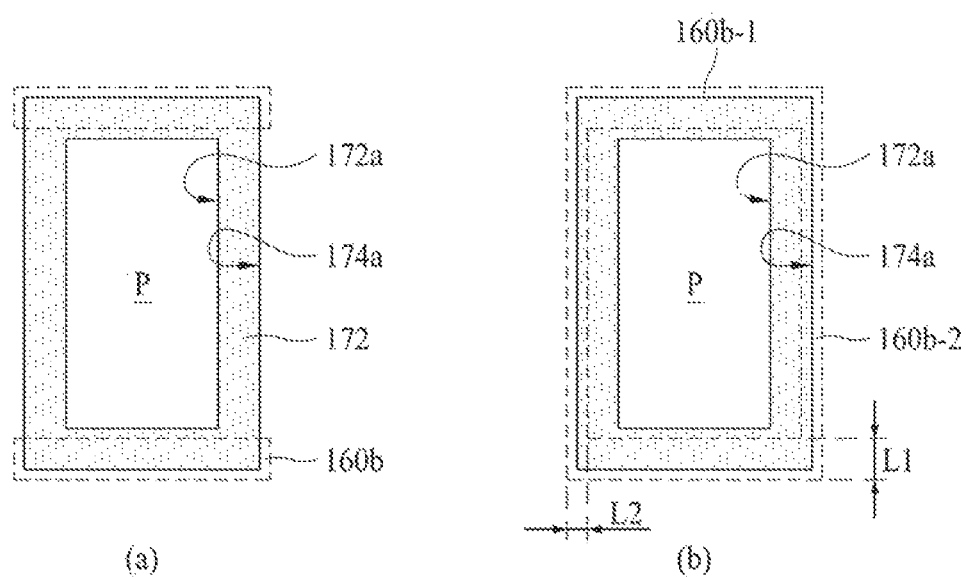
FIG. 8 includes (a) and (b) which are plane views illustrating that one pixel area of an electroluminescent display device is enlarged.

FIG. 8 includes views (a) and (b) which are plane views illustrating that one pixel area shown in FIG. 3 is enlarged.

Referring to (a) of FIG. 8, the pixel area P has a long axis and a short axis, and the step difference portion 160b is arranged at the edge of the pixel area P along a short axis direction of the pixel area P. When the pixel area P has a long axis and a short axis, a portion having a big difference in a drying speed from the center is a side portion of the pixel area P, which is far away from the center at a linear distance, that is, both ends of the long axis. In other words, a solution of both end edges of the long axis has a fast drying speed, whereby a big difference in film uniformity occurs between the edge adjacent to both short axes and the center. Therefore, the step difference portion 160b is formed along a short axis direction of the pixel area P, whereby film uniformity at the edge adjacent to both short axes and film uniformity of the center are improved.

Also, as shown in (b) of FIG. 8, the step difference portion 160b may include a first step difference portion 160b-1 formed at the edge of the pixel area P along a short axis direction of the pixel area P and a second step difference portion 160b-2 vertical to the first step difference portion 160b-1, formed along a long axis direction of the pixel area P. At this time, a width L1 of the first step difference portion 160b-1 in a direction parallel with the long axis direction of the pixel area P may be different from a width L2 of the second step difference portion 160b-2 in a direction parallel with the short axis direction of the pixel area P. In more detail, the width L1 of the first step difference portion 160b-1 in a direction parallel with the long axis direction of the pixel area P may be wider than the width L2 of the second step difference portion 160b-2 in a direction parallel with the short axis direction of the pixel area P. Alternatively, the first step difference portion 160b-1 may have a depth deeper than that of the second step difference portion 160*b*-2. This is because that a drying speed at the edge adjacent to both short axes has a bigger difference from a drying speed at the center than that at the edge adjacent to both long axes, as described above. Therefore, the entire edges of the pixel area P adjacent to the long axis and the short axis may be formed to have film uniformity similar to that of the center.

Figure 9:
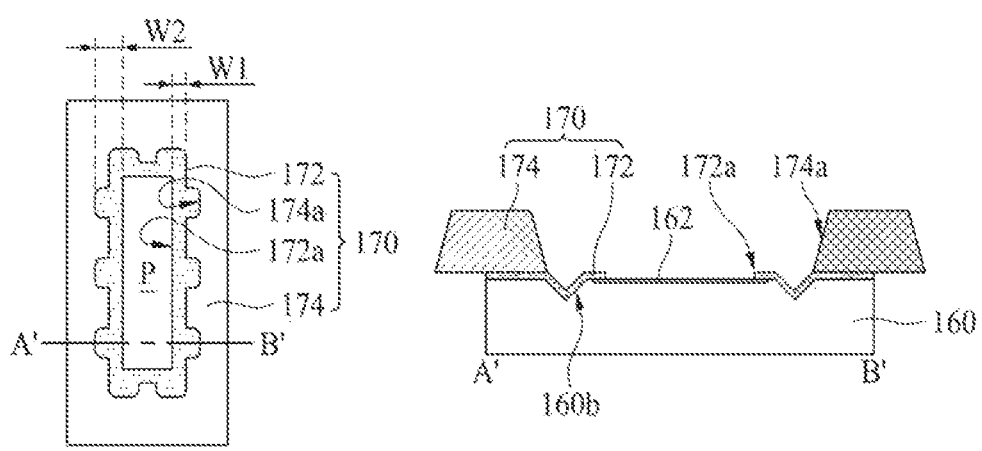
FIG. 9 illustrates plane and cross-sectional views of a pixel structure of an electroluminescent display device according to another embodiment of the present invention.

FIG. 9 illustrates plane and cross-sectional views of a pixel structure of an electroluminescent display device according to another embodiment of the present invention. This embodiment is different from one embodiment of the present invention in the bank 170 and the step difference portion 160*b*. Therefore, the bank 170 and the electroluminescent diode layer D will only be described, and repeated description of the same elements will be omitted or may be brief.

Referring to FIG. 9, the bank 170 includes an upper bank 174 for partitioning the pixel areas P, and a lower bank 172 having a width wider than that of the upper bank 174, partially exposed by the upper bank 174. The lower bank 172 exposed by the upper bank 174 is protruded from a side of the upper bank 174 to the pixel area P. The protruded lower bank 172 covers the edge of the first electrode 162.

At this time, the lower bank 172 exposed by the upper bank 174 includes areas having different areas (or shapes or outlines) within the pixel area P. For example, the lower bank 172 exposed by the upper bank 174 may include a first area having a first width W1 from an inclined surface at one side of the upper bank 174 to an end at one side of the lower bank 172, and a second area having a second width W2 wider than the first width W1. Also, the second areas adjacent to each other may be formed to be spaced apart from each other.

If the second area is formed in this way, a non-uniform coating portion of ink generated by printing of the light emitting layer may be repaired.

In more detail, a portion where the first electrode 180 is in contact with the light emitting layer becomes a light emitting area, and a portion where the lower bank 172 is not in contact with the light emitting layer becomes a non-light emitting area. When the light emitting layer is printed by inkjet printing and then dried, non-diffusion of ink occurs in the edge portion of the pixel area P, whereby a problem occurs in that coating is not performed uniformly. In this instance, non-diffusion of ink affects the light emitting area, whereby a blind spot or a spot occurs. Even though repair is performed, coating of the light emitting layer within the light emitting area does not become uniform, whereby lifespan of the electroluminescent diode is reduced.

Therefore, in the electroluminescent display device according to another embodiment of the present invention, the lower bank 172 exposed by the upper bank 174 has an area of which exposed width is wider, whereby non-diffusion of ink may be guided to a wider area. That is, the lower bank 172 exposed by the upper bank 174 may include a first area having a first width W1 from an inclined surface 174*a* at one side of the upper bank 174 to an end 172*a* at one side of the lower bank 172 and a second area having a second width W2 wider than the first width W1, and may guide non-diffusion of ink to the second area. Since the second area is more spaced apart from the light emitting area than the first area, even though repair is performed for the portion where non-diffusion of ink occurs, repair may not affect the light emitting area.

Also, the step difference portion 160*b* may be arranged in the second area.

That is, the step difference portion may more improve film uniformity of the edge and the center within the pixel area.

According to one or more embodiments of the present invention, the following advantages may be obtained.

In the electroluminescent display device according to one example embodiment of the present invention, the light emitting layer is formed by the soluble process, whereby the manufacturing cost is reduced and the electroluminescent display device of a large area may be provided.

Also, since the step difference portion is provided at the edge of the pixel area, the light emitting layer of a uniform thickness may be formed, whereby image quality may be improved.

Also, increase of power consumption and lifespan deterioration, which are caused by the light emitting layer of a non-uniform thickness, may be avoided.

It will be apparent to those skilled in the art that various modifications and variations can be made in the present invention without departing from the spirit or scope of the inventions. Thus, it is intended that the present invention covers the modifications and variations of this invention provided they come within the scope of the appended claims and their equivalents.

What is claimed is:

1. An electroluminescent display device comprising:
   a substrate in which a plurality of pixel areas are defined;
   a first electrode arranged in each pixel area;
   a first bank on the first electrode;
   a second bank on the first bank;
   a light emitting layer on the first electrode within the pixel area;
   a second electrode on the light emitting layer; and
   a step difference portion arranged at an edge of the pixel area,
   wherein the first bank is partially exposed by the second bank, is protruded from a side of the second bank to the pixel area and is disposed on the step difference portion, and
   wherein a lowest planar surface of the first bank is disposed coplanar with a lowest planar surface of the first electrode in the pixel area.

2. The electroluminescent display device of claim 1, wherein the step difference portion is partially or fully filled with the light emitting layer.

3. The electroluminescent display device of claim 1, further comprising:
   a first passivation film between the first electrode and the substrate,
   wherein the step difference portion is formed in the first passivation film.

4. The electroluminescent display device of claim 1, wherein each pixel area has a long edge and a short edge, and the step difference portion has at least one step difference portion arranged at the short edge of the each pixel area.

5. The electroluminescent display device of claim 1, wherein each pixel area has a long edge and a short edge, and the step difference portion has a first step difference portion arranged at the short edge of the each pixel area, and a second step difference portion arranged at the long edge of the each pixel area.

6. The electroluminescent display device of claim 5, wherein the first step difference portion has a width or depth wider or deeper than the second step difference portion.

7. The electroluminescent display device of claim 1, wherein the step difference portion is arranged in an area overlapped with the first bank.

8. The electroluminescent display device of claim 3, wherein the first bank and the first passivation film are in contact with each other at the step difference portion.

9. The electroluminescent display device of claim 3, further comprising:
a second passivation film arranged between the first electrode and the substrate,
wherein the first bank and the second passivation film are in contact with each other at the step difference portion.

10. The electroluminescent display device of claim 1, wherein the step difference portion has a plurality of levels.

11. The electroluminescent display device of claim 3, wherein the first passivation film corresponding to the edge of the pixel area has a thickness thinner than that of the first passivation film corresponding to a center of the pixel area.

12. An electroluminescent display device comprising:
a substrate in which a plurality of pixel areas are defined;
a first electrode arranged in each pixel area;
a first bank on the first electrode;
a second bank on the first bank;
a light emitting layer on the first electrode within the pixel area;
a second electrode on the light emitting layer; and
a first passivation film arranged below the first electrode,
wherein the first passivation film corresponding to an edge of the pixel area is thinner than that of the first passivation film corresponding to a center of the pixel area,
wherein the first bank is partially exposed by the second bank, is protruded from a side of the second bank to the pixel area and is disposed on the edge of the pixel area, and
wherein a lowest planar surface of the first bank is disposed coplanar with a lowest planar surface of the first electrode in the pixel area.

13. The electroluminescent display device of claim 12, further comprising:
a second passivation film arranged below the first electrode.

14. An electroluminescent display device comprising:
a substrate in which a plurality of pixel areas are defined;
a first electrode arranged in each pixel area, and having a gutter located at a periphery of the first electrode;
a first bank on the first electrode;
a second bank on the first bank;
a light emitting layer on the first electrode within the pixel area; and
a second electrode on the light emitting layer,
wherein the first bank is partially exposed by the second bank, is protruded from a side of the second bank to the pixel area and is disposed on the gutter, and
wherein a lowest planar surface of the first bank is disposed coplanar with a lowest planar surface of the first electrode in the pixel area.

15. The electroluminescent display device of claim 14, further comprising a first passivation film arranged between the first electrode and the substrate,
wherein the first passivation film includes a step difference portion that overlaps the gutter of the first electrode.

* * * * *